US006648655B1

(12) United States Patent
Howell et al.

(10) Patent No.: US 6,648,655 B1
(45) Date of Patent: Nov. 18, 2003

(54) LAND GRID ARRAY SOCKET WITH SUPPORTING MEMBERS

(75) Inventors: David Gregory Howell, Gilbert, AZ (US); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/191,036

(22) Filed: Jul. 2, 2002

(51) Int. Cl.[7] .......................... H01R 12/00; H05K 1/00
(52) U.S. Cl. ............................................... 439/71
(58) Field of Search ..................... 439/71, 70, 66, 439/83, 72, 73, 246, 247, 248

(56) References Cited

U.S. PATENT DOCUMENTS 6,132,220 A  * 10/2000 McHugh et al. .............. 439/66
6,152,756 A  * 11/2000 Huang et al. ................ 439/342
6,179,624 B1 * 1/2001 McHugh et al. .............. 439/71
6,203,331 B1 * 3/2001 McHugh et al. .............. 439/71
6,220,884 B1 * 4/2001 Lin .............................. 439/342

* cited by examiner

Primary Examiner—Javaid H. Nasri
(74) Attorney, Agent, or Firm—Wei Te Chung

(57) ABSTRACT

An LGA socket (1) for electrically connecting an LGA package (3) to a PCB (4) includes a low-profile insulative housing (10) defining a plurality of passageways (13) that receive a plurality of terminals (20) therein. A pair of slots (14) is defined in opposite sides of the housing, each slot accommodating a flexible supporting member (15). Each supporting member includes a base portion (16) connecting with the housing, a pair of cantilever arms (17) extending from the base portion, and a deflectable supporting block (18) formed at a free end of each arm. Each supporting block has a first supporting portion (181) protruding beyond a top surface (11) of the housing, and a second supporting portion (182) extending toward a bottom surface (12) of the housing. The supporting block can deflect in the slot relative to the base portion of the housing, and thereby support the socket on the PCB.

2 Claims, 4 Drawing Sheets

LAND GRID ARRAY SOCKET WITH SUPPORTING MEMBERS

BACKGROUND OF THE INVENTION

1. Field of the Invention

The present invention relates to electrical connectors, and more particularly to a land grid array (LGA) socket for electrically connecting a central processing unit (CPU) to a printed circuit board (PCB).

2. Description of the Prior Art

An integrated circuit (IC) package having leads arranged in a land grid array (LGA) is known as an LGA package. LGA packages have relatively low height, which saves valuable space in electronic assemblies.

Connectors for removably mounting an LGA package on a PCB are known as LGA sockets. An LGA socket combined with ball grid array (BGA) technology typically comprises a thin and substantially flat insulative housing which is positioned between the LGA package and the PCB. The housing defines an array of passageways receiving electrical contacts therein. The contacts correspond with the array of leads of the LGA package. Each contact has a pair of opposite free ends that project beyond opposite external surfaces of the housing. Prior to mounting of the LGA package, the free ends are spaced apart a predetermined distance. The free ends are respectively engaged with corresponding contact pads on a bottom surface of the LGA package, and soldered to contact pads on a mounting surface of the PCB.

Various LGA sockets combined with BGA technology are disclosed in, for example, U.S. Pat. Nos. 6,132,220, 6,179,624 and 6,203,331. One problem encountered with such conventional sockets is that during heating of solder to attach the socket to the PCB, a bottom surface of the socket may not be parallel to the PCB due to asynchronous melting of the solder balls. Molten solder may upwardly wick into the passageways of the socket and thereby adversely affect electrical performance of the contacts.

Improved CPU sockets devised to overcome the above problems are disclosed in U.S. Pat. Nos. 6,152,756 and 6,220,884. Referring to FIG. 1, a typical such CPU socket 6 comprises a plurality of spaced standoffs 61 depending beyond a bottom surface of the socket 6 toward a mounting surface of a PCB 7. When solder balls 62 are heated and melted, the standoffs 61 abut against the top surface of the PCB 7. The socket 6 is thus distanced a predetermined height above the PCB 7, with a bottom surface of the socket 6 being parallel to the top surface of the PCB 7. Accordingly, the melted solder balls 62 are prevented from wicking into the passageways 63 of the socket 6.

However, the standoffs 61 integrally extend from the bottom surface of the socket 6, and heights of the standoffs 61 are slightly less than heights of the solder balls 62. When downward force is applied to a top surface of the socket 6, the force is immediately transmitted to the solder balls 62. Thus the solder balls 62 are liable to collapse under such force before the standoffs 61 can abut against the top surface of the PCB 7 and counteract the force.

Therefore, an improved CPU socket which overcomes the above-mentioned problems is desired.

SUMMARY OF THE INVENTION

Accordingly, an object of the present invention is to provide an electrical socket having flexible standoffs which prevent damage to solder joints between the socket and a PCB.

Another object of the present invention is to provide an electrical system including an electrical package, an electrical socket and a PCB, wherein the socket can be safely and reliably mounted on the PCB when the electrical package is mounted on the socket.

A further object of the present invention is to provide supporting members for an electrical socket so that the electrical socket can be accurately aligned to be parallel with a PCB.

To achieve the above objects, an LGA socket in accordance with a preferred embodiment of the present invention comprises a low-profile insulative housing and a plurality of electrical terminals. The housing has a top surface and an opposite bottom surface. A plurality of passage ways is defined in the housing between the top and bottom surfaces. Each passageway has one electrical terminal received therein. Each terminal has a contact portion protruding beyond the top surface of the housing, and a solder portion extending toward the bottom surface of the housing. The solder portion is connected with a solder ball, and the solder ball can be soldered to a PCB. A pair of receiving slots is defined in opposite sides of the housing. Each slot has a flexible supporting member disposed therein.

Each supporting member comprises a base portion connecting with the housing, a pair of cantilever arms extending in opposite directions from the base portion, and a deflectable supporting block formed at a free end of each of the arms. Each supporting block has a first supporting portion protruding beyond the top surface of the housing, and a second supporting portion extending toward the bottom surface of the housing. The supporting block can deflect in the slot relative to the base portion of the housing, and thereby support the socket on the PCB.

Other objects, advantages and novel features of the invention will become more apparent from the following detailed description when taken in conjunction with the accompanying drawings, in which:

DESCRIPTION OF THE PREFERRED EMBODIMENTS

Figure 1:
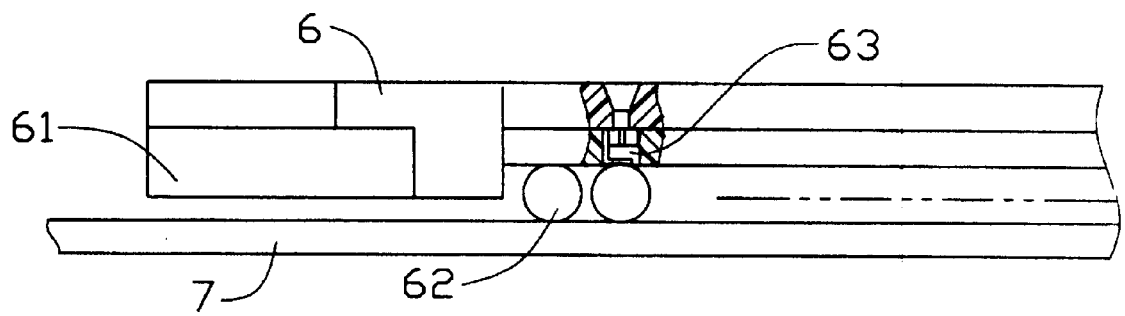
FIG. 1 is a partially cut-away schematic side plan view of a conventional BGA socket, a plurality of solder balls and a PCB, prior to the solder balls being melted by heating.

Reference will now be made to the drawing figures to describe the present invention in detail.

Figure 2:
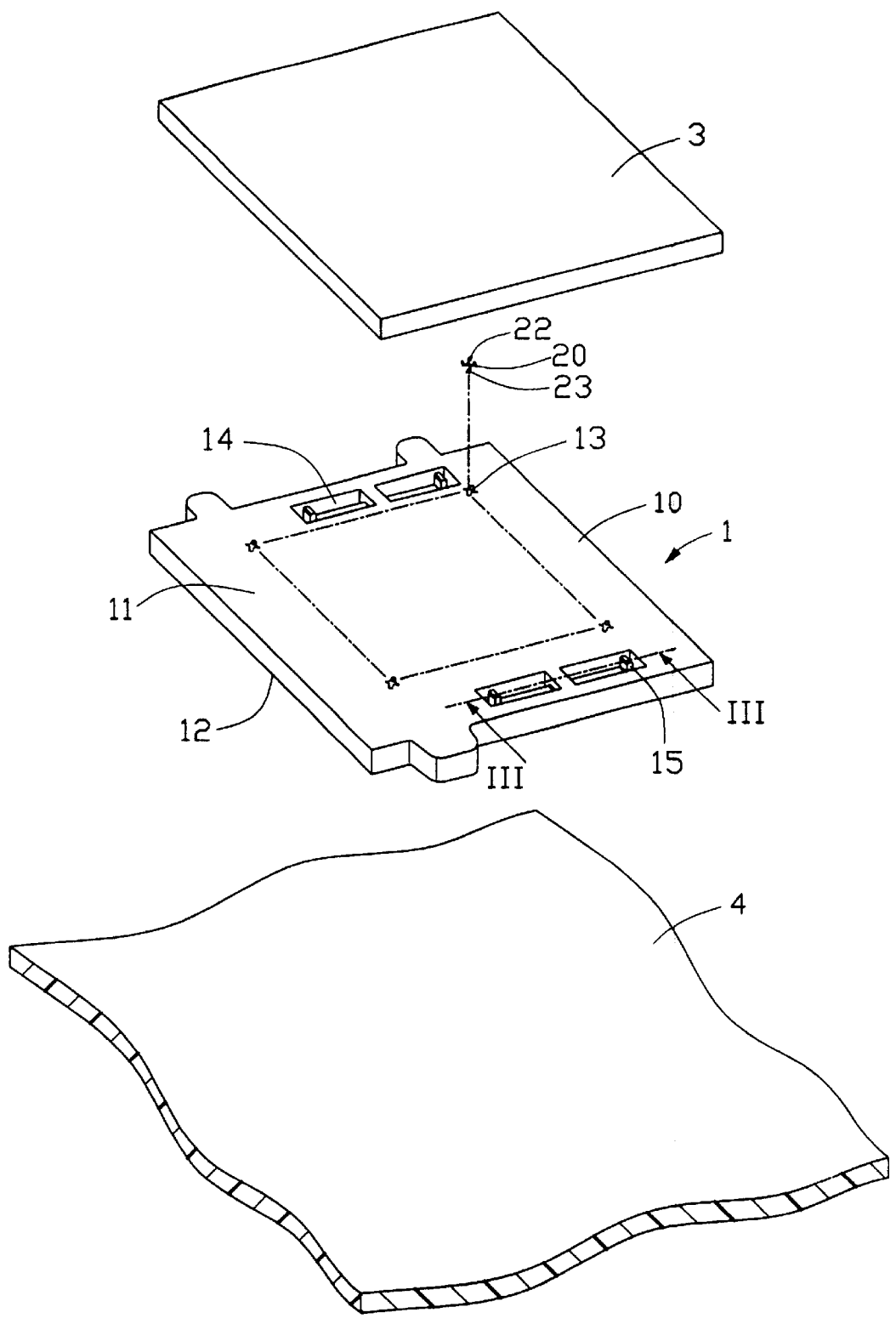
FIG. 2 is an exploded perspective view of an LGA socket in accordance with a preferred embodiment of the present invention, together with an LGA package and a PCB.
Figure 3:
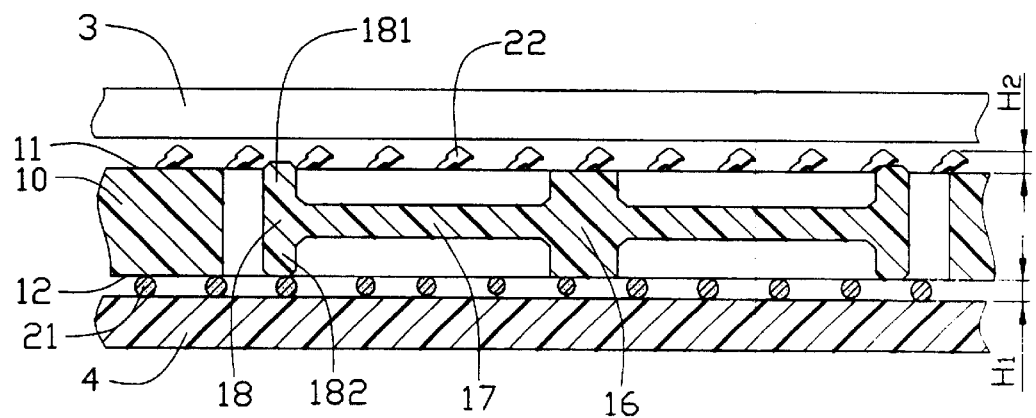
FIG. 3 is a cross-sectional view taken along line III—III of FIG. 2, showing the LGA socket located on the PCB before solder balls therebetween are melted.

Referring to FIGS. 2 and 3, an LGA socket 1 in accordance with a preferred embodiment of the present invention comprises an insulative housing 10 and a plurality of electrical terminals 20. The housing 10 has a low-profile configuration, with a flat top surface 11 and an opposite flat bottom surface 12. A plurality of passageways 13 is defined in the housing 10 between the top and bottom surfaces 11, 12. The passageways 13 respectively receive the terminals 20 therein. Each terminal 20 has a contact portion 22 protruding beyond the top surface 11 of the housing 10 for electrically contacting with a corresponding solder pad (not shown) of a land grid array (LGA) package 3, and a solder portion 23 extending toward the bottom surface 12 of the housing 10 for connection with a solder ball 21. The socket 1 can be mounted on a printed circuit board (PCB) 4, and the LGA package 3 can be movably attached to the top surface 11 of the housing 10, thereby establishing electrical connection between the LGA package 3 and the PCB 4. A pair of receiving slots 14 is defined in opposite sides of the housing 10 respectively. Each slot 14 has a flexible supporting member 15 disposed therein.

FIG. 3 shows the LGA socket 1 located on the PCB 4 before the solder balls 21 are melted. Each supporting member 15 in accordance with the preferred embodiment of the present invention comprises a base portion 16. The base portion 16 is part of the housing 10, is located substantially midway between opposite ends of the corresponding slot 14, and interconnects two opposite side faces of housing 10 that bound the slot 14. A pair of cantilever arms 17 extends in respective opposite directions from the base portion 16 toward the opposite ends of the slot 14. A supporting block 18 is formed at a free end of each cantilever arm 17. The supporting block 18 can deflect relative to the base portion 16. The supporting block 18 comprises an upper first supporting portion 181 protruding beyond the top surface 11 of the housing 10, and a lower second supporting portion 182 depending toward the bottom surface 12 of the housing 10 and being substantially flush with the bottom surface 12. The solder balls 21 are disposed under corresponding solder portions 23 of the terminals 20, and support the socket 1 on the PCB 4 such that the bottom surface 12 of the housing 10 is spaced a predetermined height H1 from the PCB 4. The contact portions 22 of the terminals 20 protrude out a predetermined height H2 beyond the top surface 11 of the housing 10. The heights H1 and H2 are substantially the same.

Figure 4:
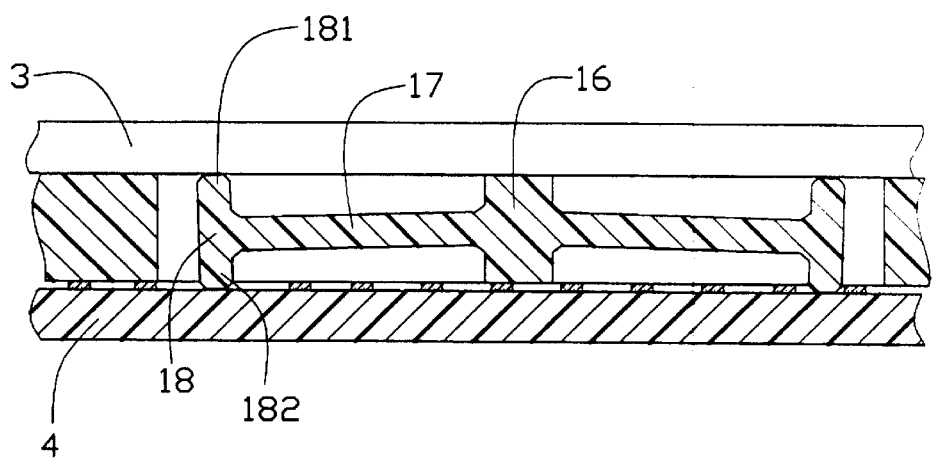
FIG. 4 is similar to FIG. 3, but showing the LGA socket mounted on the PCB after the solder balls therebetween are melted.

FIG. 4 shows the LGA socket 1 soldered on the PCB 4 with the solder balls 21 melted. The LGA package 3 is placed on the top surface 11 of the housing 10 of the LGA socket 1. The solder balls 21 are heated and melted. Downward pressing force is applied to the LGA package 3, therefore a bottom surface of the LGA package 3 presses down on the first supporting portions 181 of the supporting blocks 18. The height H1 is reduced. The contact portions 22 of the terminals 20 are pressed down to be flush with the top surface 11 of the housing 10. The second supporting portions 182 of the supporting blocks 18 are pushed down beyond the bottom surface 12 of the housing 10 and abut against a top surface of the PCB 4. Thus, the supporting blocks 18 bear some of the pressing force that would otherwise act on the melting solder balls 21. Accordingly, the solder balls 21 are protected from being collapsed by excessive force.

Figure 5:
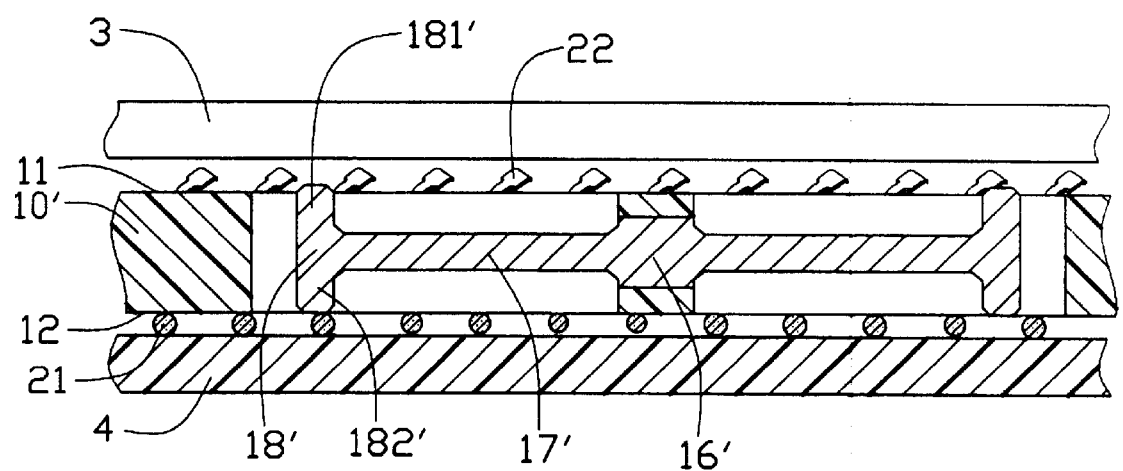
FIG. 5 is similar to FIG. 3, but showing an LGA socket in accordance with an alternative embodiment of the present invention.

It should be noted that each supporting member 15 can alternatively be a separate element from the housing 10, and can be secured in the housing 10. Such alternative supporting member may be made from a deflectable material that is different from a material of the housing 10. FIG. 5 shows a supporting member (not labeled) in accordance with an alternative embodiment of the present invention. The supporting member is made from metallic material. The supporting member comprises a base portion 16' which is fixedly inserted into a housing 10' of an LGA socket (not labeled), a pair of cantilever arms 17' extending in respective opposite directions from the base portion 16', and a pair of supporting blocks 18' formed at free ends of the cantilever arms 17' respectively. Each supporting block 18' can deflect relative to the base portion 16'. Each supporting block 18' comprises an upper first supporting portion 181' protruding beyond the top surface 11 of the housing 10', and a lower second supporting portion 182' depending toward the bottom surface 12 of the housing 10' and being substantially flush with the bottom surface 12.

It is to be understood, however, that even though numerous chacteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket for mounting on a circuit board and electrically connecting an electrical device to the circuit board, the socket comprising:
    an insulative housing having a plurality of passageways defined therein;
    a plurality of electrical terminals received in the passageways, each of the terminals having a contact portion for contacting the electrical device and an opposite solder portion for electrically connecting with the circuit board;
    at least one supporting member arranged in the housing and including a base portion connecting with the housing and at least one arm extending from the base portion, a deflectable block being formed at a free end of the at least one arm; wherein
    the block comprises a first supporting portion protruding beyond a top surface of the housing and a second supporting portion extending toward a bottom surface of the housing; wherein
    the housing defines at least one slot between the top and bottom surfaces thereof and receiving the at least one supporting member therein; wherein
    a free end of the second supporting portion is substantially flush with the bottom surface of the housing; wherein
    the contact portion protrudes beyond the top surface of the housing, and a free end of the solder portion is substantially flush with the bottom surface of the housing; wherein
    a plurality of solder balls are soldered to corresponding solder portions of the contacts, and the solder balls support the socket for spacing the socket a predetermined distance from the circuit board.

2. An electrical system, comprising:
    a circuit board having a mounting surface with a plurality of electrical paths thereon;
    a land grid array socket for mounting to the mounting surface of the circuit board, the socket including:
        an insulative housing having a top surface and a bottom surface, and a plurality of passageways defined between the top and bottom surfaces;
        a plurality of electrical terminals received in the passageways, each of the terminals having a contact portion protruding above the top surface of the housing and a solder portion extending to the bottom surface of the housing; and
        at least one standoff arranged in the housing and comprising at least one deflectable arm, the at least one deflectable arm having a first supporting portion protruding beyond the top surface of the housing and a second supporting portion extending toward the mounting surface of the circuit board; and a land grid array package adapted to abut the top surface of the housing and press the contact portions of the terminals and the first supporting portion of the at least one supporting member downwardly whereby the second supporting portion can abut against the mounting surface of the circuit board; wherein the at least one standoff further comprises a base portion connecting with the housing, the at least one deflectable arm interconnecting the base portion and the first and second supporting portions; wherein the second supporting portion terminates substantially at the bottom surface of the housing.

* * * * *